United States Patent
Sen et al.

(10) Patent No.: US 7,628,863 B2
(45) Date of Patent: *Dec. 8, 2009

(54) HEATED GAS BOX FOR PECVD APPLICATIONS

(75) Inventors: Soovo Sen, Sunnyvale, CA (US); Inna Shmurun, Foster City, CA (US); Thomas Nowak, Cupertino, CA (US); Nancy Fung, Sunnyvale, CA (US); Brian Hopper, Campbell, CA (US); Andrzej Kaszuba, San Jose, CA (US); Eller Juco, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 351 days.

This patent is subject to a terminal disclaimer.

(21) Appl. No.: 10/910,269

(22) Filed: Aug. 3, 2004

(65) Prior Publication Data
US 2006/0027165 A1 Feb. 9, 2006
US 2007/0107660 A9 May 17, 2007

(51) Int. Cl.
C23C 16/455 (2006.01)
C23F 1/00 (2006.01)
H01L 21/306 (2006.01)
C23C 16/06 (2006.01)
C23C 16/22 (2006.01)

(52) U.S. Cl. .............. 118/715; 156/345.29; 156/345.33

(58) Field of Classification Search ................. 118/723, 118/715; 156/345.29, 345.33
See application file for complete search history.

(56) References Cited
U.S. PATENT DOCUMENTS

| | | | |
|---|---|---|---|
| 4,686,354 A * | 8/1987 | Makin | 392/472 |
| 5,300,322 A | 4/1994 | Lowden | |
| 5,376,213 A * | 12/1994 | Ueda et al. | 156/345.27 |
| 5,595,606 A | 1/1997 | Fujikawa et al. | |
| 5,772,773 A | 6/1998 | Wytman | |
| 5,950,925 A * | 9/1999 | Fukunaga et al. | 239/132.3 |
| 6,079,356 A | 6/2000 | Umotoy et al. | |
| 6,090,442 A | 7/2000 | Klaus et al. | |
| 6,103,014 A | 8/2000 | Lei et al. | |

(Continued)

FOREIGN PATENT DOCUMENTS

EP 1 296364 3/2003

(Continued)

OTHER PUBLICATIONS

PCT International Search Report dated Feb. 22, 2006 for PCT/US05/027612.

(Continued)

*Primary Examiner*—Rudy Zervigon
(74) *Attorney, Agent, or Firm*—Patterson & Sheridan

(57) ABSTRACT

A method and apparatus for a chamber for chemical vapor deposition on a substrate in a processing region comprising a gas box having a heated lid comprising a gas inlet passage, and a face plate connected to the heated lid positioned to conduct gas from the heated gas box to a substrate processing region. Also, a method for providing heat to a chemical vapor deposition chamber comprising supplying heat to a lid of a gas box, and heating a face plate connected to the gas box by heat transfer from the lid.

10 Claims, 5 Drawing Sheets

U.S. PATENT DOCUMENTS

| | | | |
|---|---|---|---|
| 6,153,261 A | 11/2000 | Xia et al. | |
| 6,271,054 B1 | 8/2001 | Ballantine et al. | |
| 6,277,200 B2 | 8/2001 | Xia et al. | |
| 6,326,658 B1 | 12/2001 | Tsunashima et al. | |
| 6,333,547 B1 | 12/2001 | Tanaka et al. | |
| 6,453,992 B1* | 9/2002 | Kim | 165/206 |
| 6,500,266 B1 | 12/2002 | Ho et al. | |
| 6,528,430 B2 | 3/2003 | Kwan et al. | |
| 6,559,074 B1 | 5/2003 | Chen et al. | |
| 6,566,246 B1 | 5/2003 | De Felipe et al. | |
| 6,582,522 B2 | 6/2003 | Luo et al. | |
| 6,586,343 B1 | 7/2003 | Ho et al. | |
| 6,624,088 B2 | 9/2003 | Moore | |
| 6,777,352 B2 | 8/2004 | Tepman et al. | |
| 6,794,215 B2 | 9/2004 | Park et al. | |
| 6,946,033 B2* | 9/2005 | Tsuei et al. | 118/715 |
| 6,954,585 B2* | 10/2005 | Mokuo | 392/416 |
| 2002/0164890 A1 | 11/2002 | Kwan et al. | |
| 2004/0050492 A1* | 3/2004 | Tsuei et al. | 156/345.33 |
| 2004/0052969 A1* | 3/2004 | Lee et al. | 427/535 |
| 2004/0118519 A1* | 6/2004 | Sen et al. | 156/345.33 |
| 2004/0203255 A1 | 10/2004 | Itsuki | |
| 2005/0150452 A1* | 7/2005 | Sen et al. | 118/715 |
| 2005/0196971 A1* | 9/2005 | Sen et al. | 438/778 |
| 2005/0255241 A1 | 11/2005 | Murakami et al. | |
| 2006/0093756 A1* | 5/2006 | Rajagopalan et al. | 427/569 |

FOREIGN PATENT DOCUMENTS

| | | |
|---|---|---|
| WO | WO 01/99171 | 12/2001 |

OTHER PUBLICATIONS

PCT Written Opinion dated Feb. 22, 2006 for PCT/US05/027612.
U.S. Appl. No. 10/950,145; Tailored Temperature Uniformity; Filed Sep. 24, 2004.
Notice to File a Response from KR-10-2007-7003453, dated Feb. 15, 2008, copy consists of 6 pages.

* cited by examiner

HEATED GAS BOX FOR PECVD APPLICATIONS

BACKGROUND OF THE INVENTION

1. Field of the Invention

Embodiments of the present invention generally relate to a method and apparatus to provide chemical vapor deposition (CVD) of a film in a microprocessor processing chamber and to provide a mechanism for improved cleaning of the chamber.

2. Description of the Related Art

Chemical vapor deposition (CVD) chambers may be used to deposit materials such as oxides onto substrates used in the fabrication of integrated circuits and semiconductor devices. In a CVD chamber, a gas distribution plate is commonly used to uniformly distribute gases into a chamber. Such a uniform gas distribution is necessary to achieve uniform deposition of the material on the surface of a substrate located within the chamber. The gas distribution plate generally receives deposition gases from a mixing region, also known as a gas box, above the gas distribution plate. A gas inlet passage into the gas box is typically water-cooled to a temperature of approximately under 100° C. A heater is generally disposed in a substrate support member beneath the gas distribution plate. The heater is typically heated to a temperature of approximately between 100 and 600° C. Consequently, the temperature of the gas distribution plate is somewhere between the temperature of the gas inlet passage and the temperature of the heater. However, because the gas distribution plate is connected to the gas inlet passage, the temperature of the gas distribution plate is generally closer to the temperature of the gas inlet passage than the temperature of the heater.

FIG. 1 is a schematic view of a chamber that has two processing regions, 618, 620 connected to two remote plasma sources 800. One remote plasma source 800 is connected to processing region 618, and the other remote plasma source 800 is connected to processing region 620. A heater pedestal 628 is movably disposed in each processing region 618, 620 by a stem 626 which extends through the bottom of the chamber body 612 where it is connected to a drive system 603. Each of the processing regions 618, 620 includes a gas distribution assembly comprising a gas box 642 disposed through the chamber lid 604 to deliver gases into the processing regions 618, 620 through blocker plates 602. The gas distribution assembly 608 of each processing region also includes a gas inlet passage 640 which delivers gas into a gas box 642. A cooling channel 652 is formed in a base plate 648 of each gas distribution assembly 608 to cool the plate during operation. An inlet 655 delivers a coolant fluid, such as water, into the cooling channels 652 which are connected to each other by coolant line 657. The cooling fluid exits the channel through a coolant outlet 659. Alternatively, the cooling fluid is circulated through the manifold.

For CVD films such as carbon doped silicon oxide, oxygen doped silicon carbide, silicon oxide, amorphous carbon, and silicon nitride, the deposition rate is inversely proportional to temperature. As a result of the low temperature of the gas distribution plate in comparison to the temperature of the substrate heater, a film is often deposited on the gas distribution plate during processing, which leads to a longer chamber cleaning period and an increase in clean gas consumption. Another result of the low temperature of the gas distribution plate is uneven distribution of chemicals across the surface of the substrate which can lead to non-uniform film properties across the wafer.

The deposition process also typically results in deposition of some materials on the walls and components of the deposition chamber. As the materials are distributed through the gas distribution plate during processing, deposits are often formed on the gas distribution plate which may clog the holes of the plate or flake off in particles that rain down on the substrate. This reduces the uniformity of deposition on the substrate and contaminates the substrate. Consequently, it is necessary to clean the interior of the deposition chamber on a regular basis.

Several methods of cleaning the deposition chamber components including the gas distribution plate have been developed. For example, a remote plasma cleaning procedure may be employed. A high density plasma source such as a microwave plasma system, toroidal plasma generator, or similar device may be employed to generate a remote plasma. Dissociated species from the remote plasma are then transported to the deposition chamber where the species react with and etch away the undesired deposits. It is also common to remove the deposits on the interior of chamber walls with an in situ chamber clean operation. Common chamber cleaning techniques include the use of an etchant gas such as fluorine or oxygen to remove the deposited material from the chamber walls and other areas. The etchant gas is introduced into the chamber and plasma is formed so that the etchant gas reacts with and removes the deposited material from the chamber walls. Also, heat may be supplied to the chamber by heating elements or heat exchange fluid embedded in the substrate support to facilitate cleaning or other chamber processes.

Conventional chamber cleaning methods, however, still require a considerable amount of time. The longer it takes to clean the chamber, the lower the number of substrates that can be processed in a given time and the more gas that is consumed to clean the chamber.

Therefore, a need exists for an improved method for heating and distributing gases into the processing region of a deposition chamber and for cleaning a deposition chamber.

SUMMARY OF THE INVENTION

The present invention generally provides a chamber for chemical vapor deposition on a substrate in a processing region, comprising a heated gas box having a gas inlet passage and a face plate positioned to conduct gas from the heated gas box to a substrate processing region. The invention also provides a method for providing heat to a chemical vapor deposition chamber, comprising supplying heat to a substrate support and to a gas box having a gas inlet passage. Heating the gas box instead of the face plate reduces deposition within the gas box, reducing the chamber clean time. This invention reduces the clean time for CVD processes wherein the deposition rate is inversely proportional to temperature such as processes for the deposition of carbon doped silicon oxide, oxygen doped silicon carbide, silicon oxide, doped amorphous carbon, and silicon nitride.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention provides a method and an apparatus for chemical vapor deposition (CVD) of a film in a substrate processing chamber and improved cleaning of the chamber. The deposition chambers that may benefit from the apparatus and methods described herein include chambers that may be used to deposit oxides, such as carbon-doped silicon oxides, silicon containing films, and other dielectric materials including advanced patterned films (APF). An example of a deposition chamber is the Producer® Chamber, available from Applied Materials, Inc. of Santa Clara, Calif. The Producer® Chamber is a CVD chamber with two isolated processing regions that may be used to deposit carbon-doped silicon oxides and other materials. A chamber having two isolated processing regions is described in U. S. Pat. No. 5,855,681, which is incorporated by reference. The Producer® Chamber has a port to which remote plasma sources may be attached. A Producer® Chamber with a remote plasma source, model number 5707024-F, available from Advanced Energy Industries, Inc. of Fort Collins, Colo., may be used in embodiments of the methods described herein.

In the embodiments described herein, a remote plasma source may be attached to a Producer® Chamber such that one remote plasma source is connected to both isolated processing regions of the Producer® Chamber. However, the processes described below may also be performed by using two remote plasma sources connected, for example, by a tee line, to each processing region of the Producer® Chamber and by adjusting the flow rates accordingly. The gas flow rates described below refer to flow rates experienced by each of the isolated processing regions. The gas flow rates experienced by the Producer® Chamber as a whole, that is, the combination of flow rates of both of the isolated processing regions, are approximately twice the gas flow rates experienced by each of the isolated processing regions. While some examples of embodiments are described as cleaning a single processing region of a Producer Chamber that has two processing regions, the methods described herein may be used to clean a processing region of a chamber that has one or more processing regions.

Figure 1:
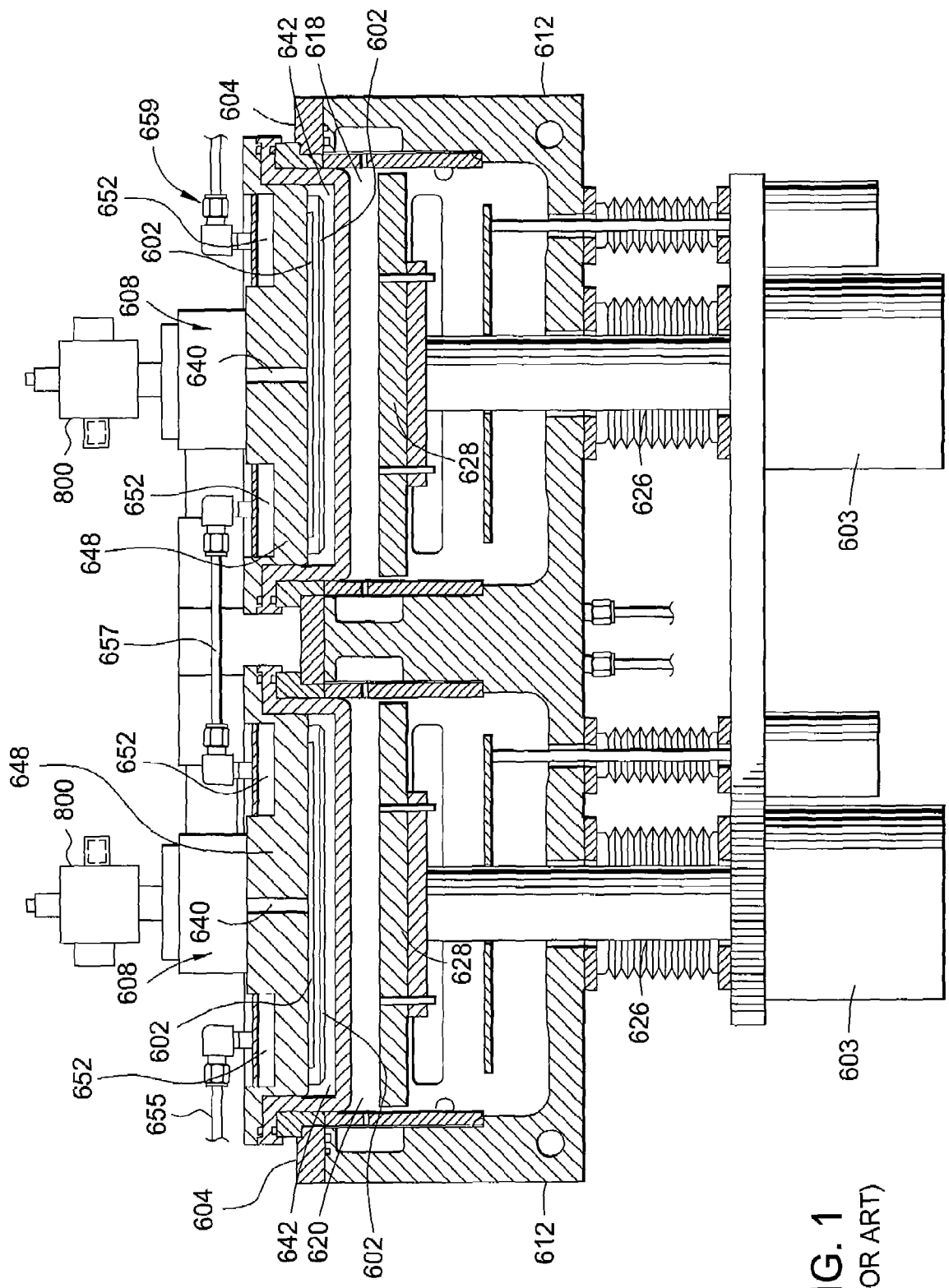
FIG. 1 (prior art) is a schematic view of a deposition chamber having a gas box that features cooling channels.
Figure 2:
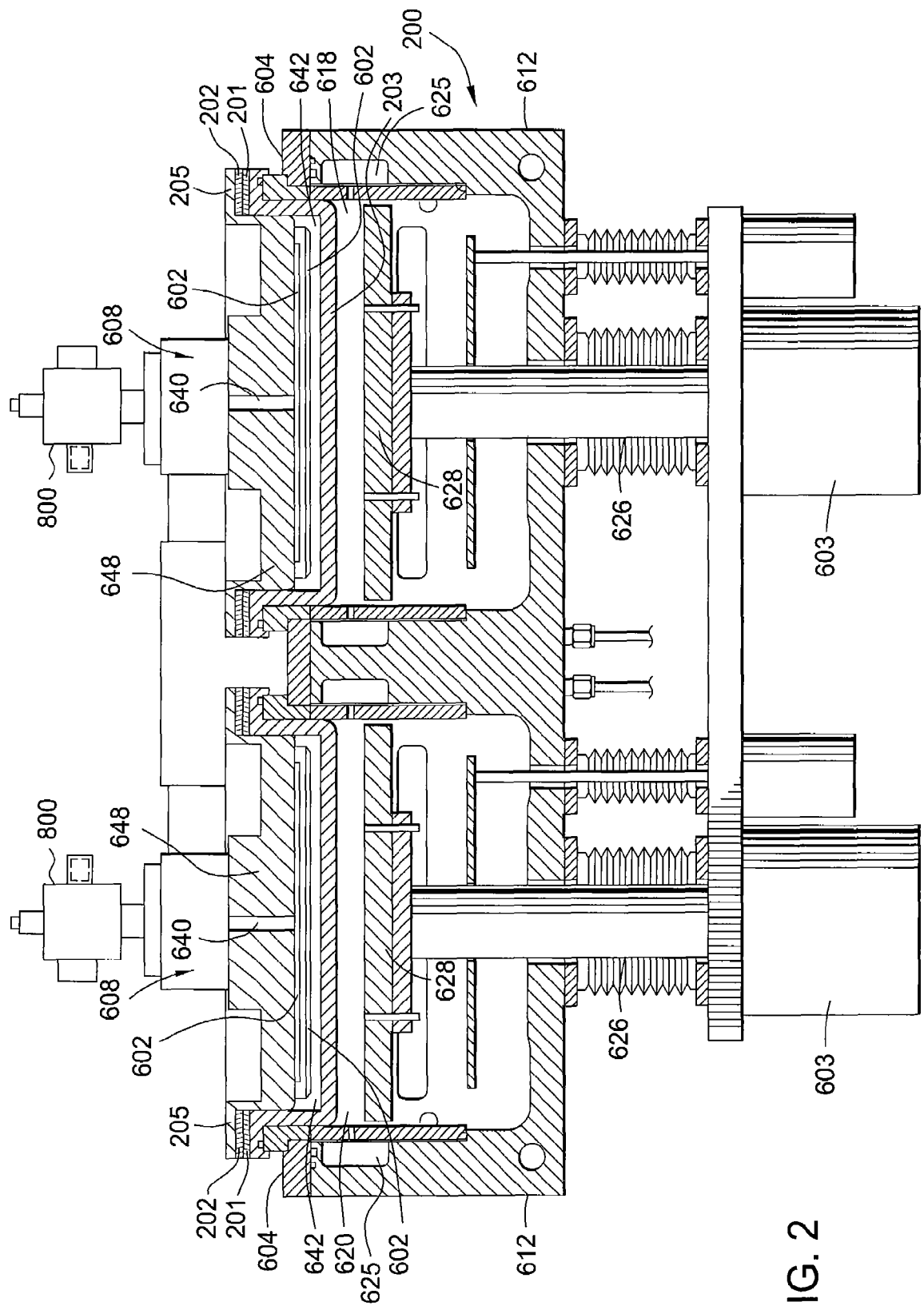
FIG. 2 is a schematic view of an embodiment of a gas distribution assembly with a heated insert.

FIG. 2 is a sectional view of an embodiment of the present invention. This chamber 200 has a gas inlet passage 640 and a gas box 642 that is heated by a heating element embedded in an annular insert 201 along the upper portion of the gas box 642 and along the upper surface of the faceplate 203. The sidewall and the interior wall define two cylindrical annular processing regions 618, 620. A circumferential pumping channel 625 is formed in the chamber walls defining the cylindrical processing regions 618, 620 for exhausting gases from the processing regions 618, 620 and controlling the pressure within each region 618, 620. The heating element insert 201 is stabilized in place with a clamping plate 202.

Insulation 205 may insulate the upper surface of the clamping plate. The heating element insert 201 may be a silicone rubber heater such as a Watlow heater with part number 168168500 available from the Watlow Corporation of St. Louis, Mo. The insert 201 may also have wire wound around its exterior surface. Thermocouples may be inserted along the surface and embedded into the center of the insert 201. The clamping plate 202 may act as an insulator. The clamping plate 202 may be made of an alloy or mixture of aluminum and stainless steel. Alternatively, insulation may be supplied along the upper surface of the insert 201 or the upper surface of the clamping plate 202.

Figure 3:
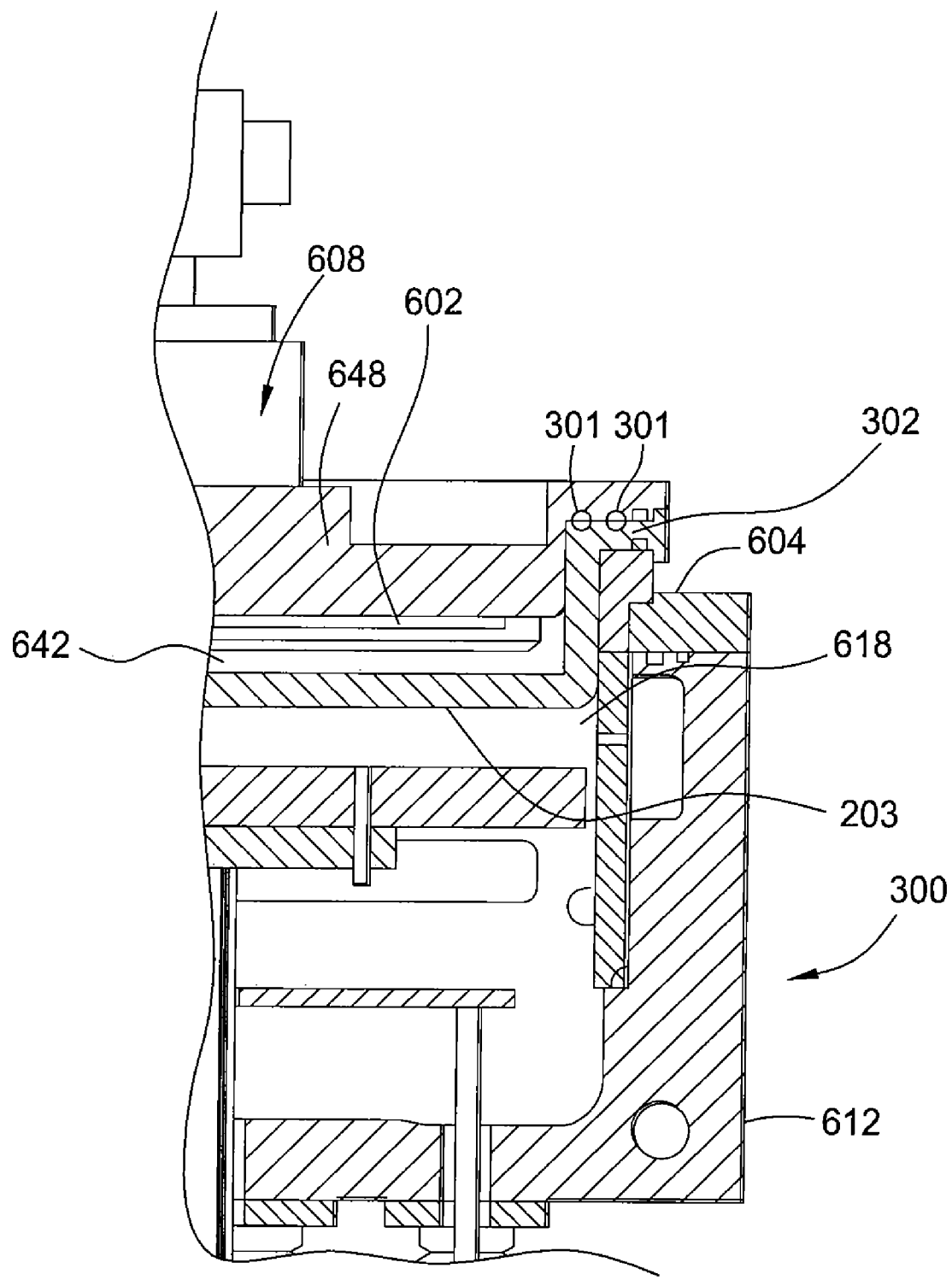
FIG. 3 is a partial sectional view of another embodiment of a gas distribution assembly with an embedded heating element.

FIG. 3 is a sectional view of another alternative embodiment of the chamber of FIG. 2. The chamber 300 has walls 302 of faceplate 203 that engage the perimeter of the gas inlet passage 640, and contain channels 301 for embedded, cast in, or inserted heating elements (not shown). The gas distribution assembly 608 is constructed from materials that conduct heat to the face plate 203 such as aluminum.

Figure 4:
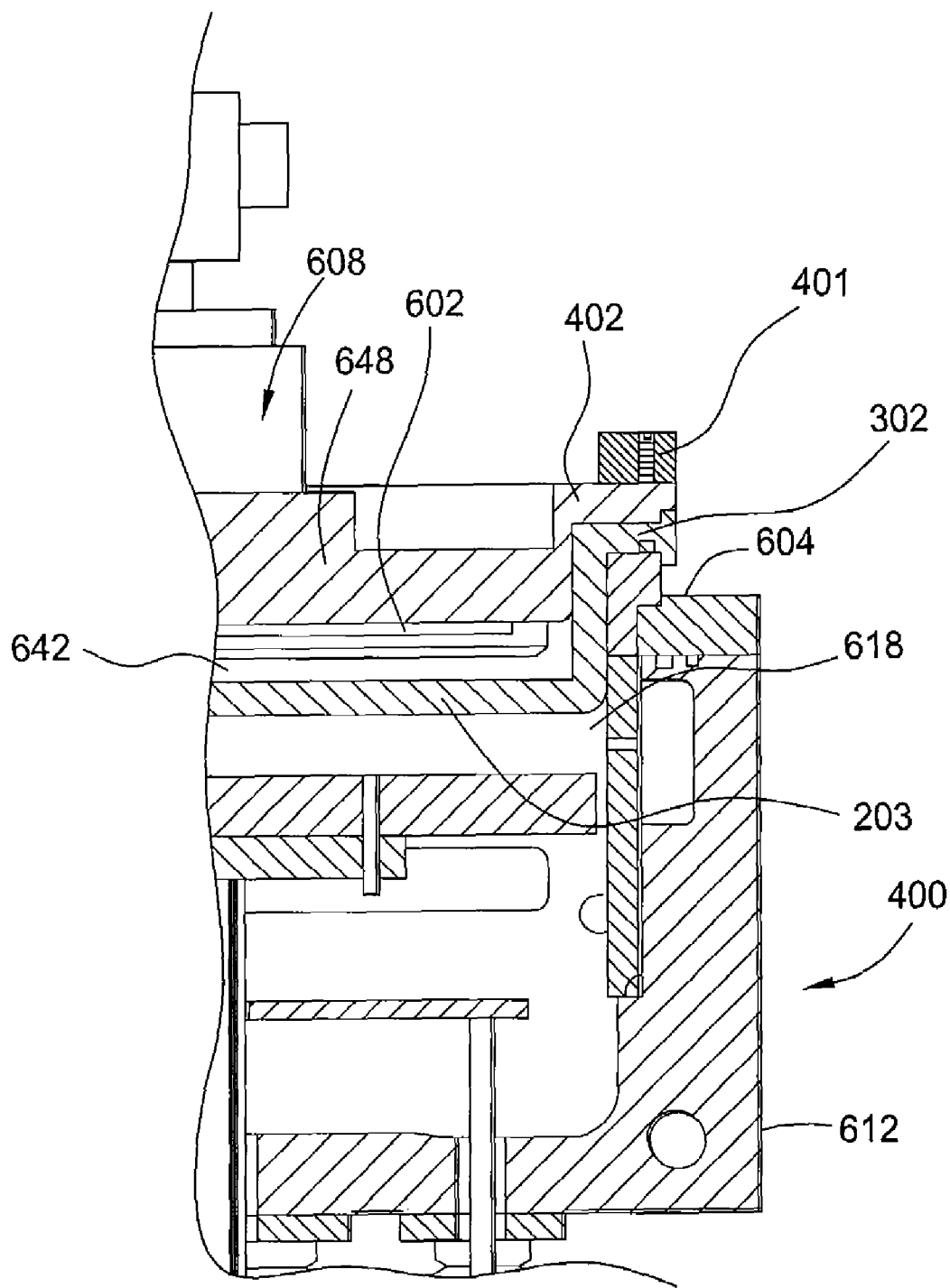
FIG. 4 is a partial sectional view of another embodiment of a gas distribution assembly with a heating element placed on top of the gas inlet passage.

FIG. 4 is a sectional view of another alternative embodiment of the chamber of FIG. 2. This chamber 400 has a gas inlet passage 640 with an insert 401 along the top of the gas inlet passage 640. The insert 401 is a ring shaped heater that is solid metal with an embedded heating element. The insert 401 is clamped to the top of the base plate 402. The insert 401 may be made out of an aluminum alloy. A blocker plate 602, which is attached to base plate 402 may also be made out of a conductive material such as aluminum to facilitate heat transfer to the face plate 203. The face plate 203 may also be made out of aluminum.

Figure 5:
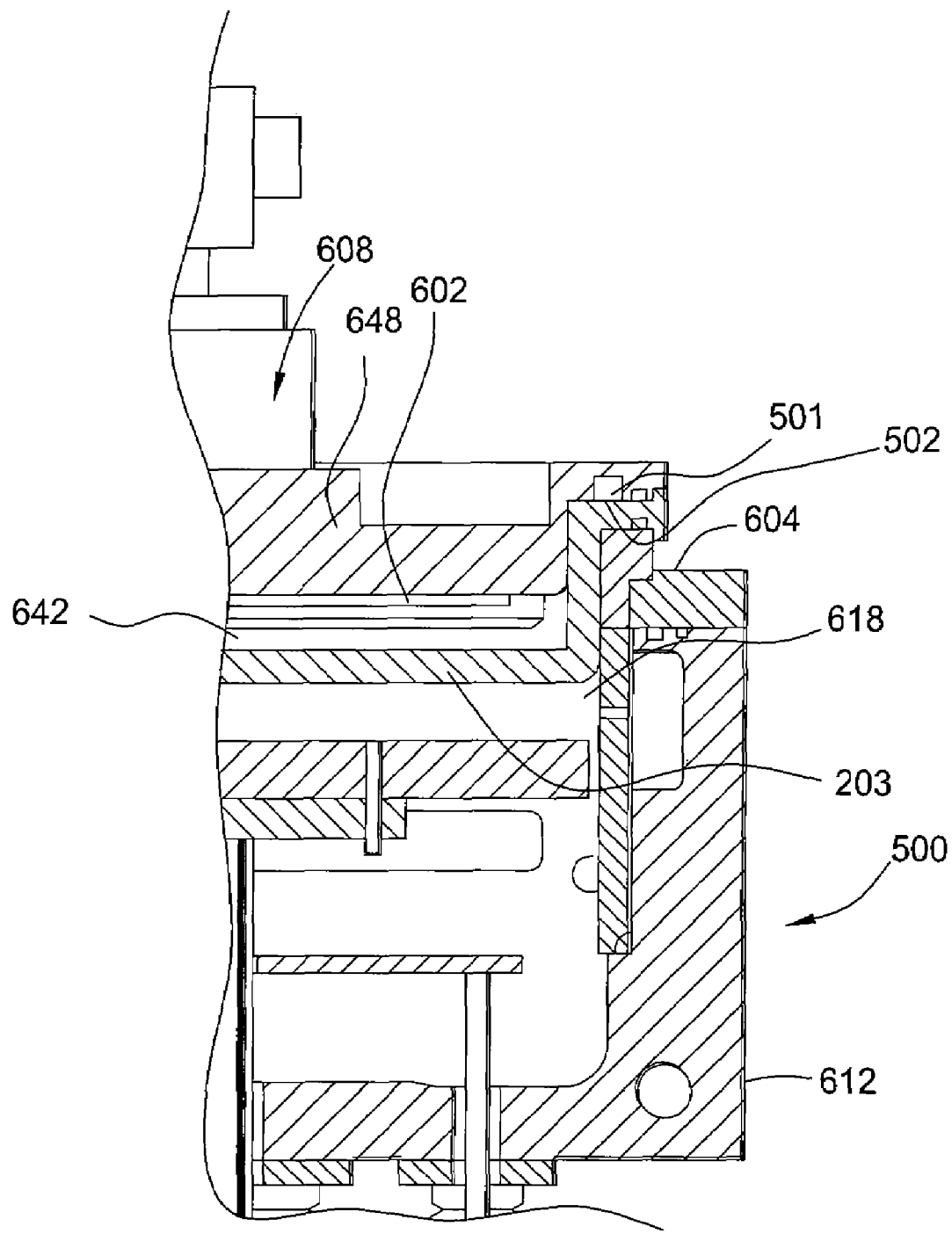
FIG. 5 is a partial sectional view of another embodiment of a gas distribution assembly with a heating element placed along the side of the gas inlet passage.

FIG. 5 is a sectional view of another alternative embodiment of the chamber of FIG. 2. This chamber 500 has a gas inlet passage 640 with an insert 501 on the top edge of the support 502 for the face plate 203 and along the circumference of the bottom edge of the blocker plate 602. The diameter of gas inlet passage 640 may be reduced to accommodate the insert 501. The insert 501 may be made out of an aluminum alloy. The insert 501 may have an embedded heating element or the heating element may be located in grooves in the middle of the insert 501.

In operation, the process and carrier gases may be preheated prior to entering the gas inlet passage 640. Also, as the gas enters the gas box, it is further heated by the various heating elements shown in FIGS. 2-5. The gas then flows through the face plate and enters the processing region of the chamber. The face plate is heated directly by the gas as it leaves the gas inlet passage and indirectly by the heat supplied to the gas box.

Heating the gas box indirectly heats the face plate which may reduce recombination of the etchant species, hence improving the etch rate. It also reduces deposition within the gas box and hence reduces the clean time. This reduction in the clean time for CVD processes when the deposition rate is inversely proportional to temperature can be desirable for films such as carbon doped silicon oxide, oxygen doped silicon carbide, silicon oxide, amorphous carbon, and silicon nitride.

As the set point temperature of the gas inlet passage is increased from 75 to 200° C., the temperature of the face plate edge increases from about 100 to about 175° C. When the temperature of the face plate edge is plotted as a function of the set point temperature, the slope of the line is curved. As the set point temperature of the gas inlet increases from 75 to 125° C., the face plate edge temperature increases from about 100 to about 110° C. As the gas inlet set point increases from 125 to 200° C., the face plate edge temperature increases from about 110 to about 175° C.

When 9000 sccm of preheated helium at 6 Torr was introduced to the heated gas inlet passage and processing region of a chamber with 200 mm between the substrate and face plate, the temperature of the edge and the center of the face plate was plotted as a function of the set point temperature of the gas inlet passage. The curve of the line for both the temperature at the center of the face plate and the edge of the face plate were similar. The temperature of the center of the face plate was about 80° C. warmer than the edge of the face plate.

To illustrate how the heated gas box influences carbon doped silicon oxide film deposition, trimethylsilane in oxygen with helium was introduced to the chamber. The gas box and substrate support were heated to 120, 150, 175, and 200° C. As the temperature increased, the film thickness and film deposition rate increased across the surface of the substrate and undesirable deposit formation along the other chamber surfaces such as the face plate decreased.

To illustrate how the heated gas box influences an alternative carbon doped silicon oxide film deposition, octamethylcyclotetrasiloxane and oxygen were introduced into the chamber. The gas inlet passage and substrate support were heated to 120, 150, 175, and 200° C. As the temperature increased, the film thickness increased from about 7800 to about 9600 Å during 60 second testing. The film deposition rate increased from about 7800 to about 9600 Å/min during 60 second testing.

A triethyloxysilane film on undoped silicon glass was etched at different temperatures. A plot of etch rate as a function of the substrate support and gas inlet passage temperature set point revealed that as the temperature of the substrate support and the gas inlet passage were increased, the etch rate of the film also increased. The etch rate of a system with a gas inlet passage at 200° C. was more than twice the etch rate of a conventional system.

The etch rate across the surface of the substrate was measured at the center, the edge, and half way between the edge and the center of the substrate. A trimethylsilane film was deposited on coupons. The etch was performed with the gas inlet passage at 200° C. and the substrate support at 350° C. for 15 seconds. $NF_3$ was fed to the system at 2500 sccm with helium at 9000 sccm. The pressure was 6 Torr. The film was deposited in a 200 mm layer. One measurement was taken for the center and four measurements were taken for the middle and edge of the substrate. The average etch rate along the edge was about 115 kÅ/min. The average etch rate along the middle of the substrate was about 134 kÅ/min. The center etch rate was about 120 kÅ/min.

The chamber mount optical endpoint trace was measured when the gas inlet passage was set to 200° C. with 1500 sccm $NF_3$ and 1000 sccm He flow at 6 Torr. The plasma was set to 350 W. The film thickness was 450 mm. The voltage was measured as a function of time. The endpoint for 1 mm of carbon doped silicon oxide was approximately 70 seconds.

Repeatability tests with shorter clean times than conventional system clean times yielded substrates that did not have particle spikes. Also, the chamber was clean when inspected after the repeatability tests.

While the foregoing is directed to embodiments of the present invention, other and further embodiments of the invention may be devised without departing from the basic scope thereof, and the scope thereof is determined by the claims that follow.

The invention claimed is:

1. A chamber for chemical vapor deposition on a substrate in a processing region, comprising:
    a chamber body having a processing region defined therein;
    a chamber lid disposed on the chamber body;
    a gas distribution assembly coupled to the chamber lid, the gas distribution assembly comprising a face plate and a base plate, the face plate having a center gas passage region, a cylindrical wall extending upwards from an outer portion of the center gas passage region, and an annular flange extending outward from the cylindrical wall, the base plate having a flange concentrically stacked with the flange of the face plate, the flanges supported above the chamber lid;
    a gas box defined in the gas distribution assembly between the face plate and base plate, wherein the gas box directs gas into the processing region through the center gas passage region of the face plate; and
    a heated annular insert coupled to the flange of the base plate of the gas distribution assembly vertically above the flange of the face plate, the insert arranged to heat the gas box and the face plate, wherein the heated annular insert is concentric with the face plate and vertically spaced from the lid.

2. The chamber of claim 1, wherein a heating element is embedded in the insert.

3. The chamber of claim 1, wherein a heating element is embedded in the insert located along an upper surface of the gas distribution assembly.

4. The chamber of claim 1, wherein the insert is a silicon rubber insert.

5. The chamber of claim 4, wherein the silicon rubber insert further comprises a wire coil.

6. The chamber of claim 1, wherein the insert is a metal heater ring.

7. The chamber of claim 1, wherein the base plate further comprises:
    a gas inlet passage fluidly coupled to the gas box, wherein the insert is in contact with the base plate.

8. The chamber of claim 7, wherein the insert has a heating element embedded therein.

9. A chamber for chemical vapor deposition on a substrate in a processing region, comprising:
    a chamber body having a processing region defined therein;
    a chamber lid disposed on the chamber body; and
    a heated gas distribution assembly coupled to the chamber lid, the gas distribution assembly further comprising:
        a face plate having a first side of a center gas passage region exposed to the processing region and a flange disposed on top of the chamber lid, the center gas passage region coupled to the flange by an annular wall, wherein the center gas passage region is radially inward of the annular wall and the flange is radially outward of the annular wall;
        a gas box defined on a second side of the face plate, the second side facing away from the processing region; and
        a heating element disposed on top of the flange of the face plate, wherein the flange of the face plate is disposed between the heating element and the chamber lid, the heating element arranged to heat the face plate.

10. The chamber of claim 9, wherein the heating element is an annular ring concentric with the face plate.

* * * * *